(12) United States Patent
Shah et al.

(10) Patent No.: US 12,182,455 B2
(45) Date of Patent: *Dec. 31, 2024

(54) DATA PROCESSING NEAR DATA STORAGE

(71) Applicant: Intel Corporation, Santa Clara, CA (US)

(72) Inventors: Nilesh N. Shah, Folsom, CA (US); Chetan Chauhan, Folsom, CA (US); Shigeki Tomishima, Portland, OR (US); Nahid Hassan, San Jose, CA (US); Andrew Chaang Ling, Toronto (CA)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/389,525

(22) Filed: Nov. 14, 2023

(65) Prior Publication Data
US 2024/0078051 A1    Mar. 7, 2024

Related U.S. Application Data

(63) Continuation of application No. 17/681,512, filed on Feb. 25, 2022, now Pat. No. 11,868,665, which is a (Continued)

(51) Int. Cl.
*G11C 13/00* (2006.01)
*G06F 3/06* (2006.01)
*G06N 5/04* (2023.01)

(52) U.S. Cl.
CPC .......... *G06F 3/0679* (2013.01); *G06F 3/0613* (2013.01); *G06F 3/0644* (2013.01);
(Continued)

(58) Field of Classification Search
CPC .... G06F 3/0679; G06F 3/0613; G06F 3/0644; G06F 3/0631; G06F 3/0659; G06F 3/067;
(Continued)

(56) References Cited

U.S. PATENT DOCUMENTS

| 11,262,954 B2* | 3/2022 | Shah | G06F 3/0631 |
| 11,868,665 B2* | 1/2024 | Shah | G06F 3/0631 |

(Continued)

OTHER PUBLICATIONS

Belova, Anna, et al., "Accelerate Deep Learning Inference with Integrated Intel® Processor Graphics Rev 2.0", Published May 29, 2018, 20 pages.
(Continued)

*Primary Examiner* — Hoai V Ho
*Assistant Examiner* — Minh Dinh
(74) *Attorney, Agent, or Firm* — Compass IP Law PC

(57) ABSTRACT

Examples herein relate to a solid state drive that includes a media, first circuitry, and second circuitry. In some examples, the first circuitry is to execute one or more commands. In some examples, the second circuitry is to receive a configuration of at one type of command, where the configuration is to define an amount of media bandwidth allocated for the at one type of command; receive a command; and assign the received command to the first circuitry for execution.

20 Claims, 12 Drawing Sheets

Related U.S. Application Data continuation of application No. 16/779,086, filed on Jan. 31, 2020, now Pat. No. 11,262,954.

(60) Provisional application No. 62/886,498, filed on Aug. 14, 2019.

(52) U.S. Cl.
CPC .......... *G06N 5/04* (2013.01); *G11C 13/0004* (2013.01); *G11C 13/0007* (2013.01)

(58) Field of Classification Search
CPC ...... G06F 13/1605; G06N 5/04; G06N 3/045; G06N 3/063; G11C 13/0004; G11C 13/0007; G11C 7/1006
USPC .......................................................... 711/102
See application file for complete search history.

(56) References Cited

U.S. PATENT DOCUMENTS

| | | |
|---|---|---|
| 2001/0054163 A1 | 12/2001 | Teglia |
| 2010/0115167 A1 | 5/2010 | Tardieux et al. |
| 2011/0098056 A1 | 4/2011 | Rhoads et al. |
| 2019/0107957 A1 | 4/2019 | Helmick et al. |
| 2020/0244583 A1 | 7/2020 | Smith et al. |
| 2021/0019085 A1 | 1/2021 | Zhu et al. |

OTHER PUBLICATIONS

European First Office Action, (EP Exam Report Article 94(3) EPC), for Patent Application No. 20181137.9, Mailed Dec. 2, 2022, 8 pages.

Extended European Search Report for Patent Application No. 20181137.9, Mailed Dec. 4, 2020, 9 pages.

First Office Action for U.S. Appl. No. 16/779,086, Mailed Apr. 15, 2021, 21 pages.

First Office Action for U.S. Appl. No. 17/681,512, Mailed Mar. 22, 2023, 23 pages.

Glorot, Xavier, et al., "Deep Sparse Rectifier Neural Networks", Appearing in Proceedings of the 14th International Conference on Artificial Intelligence and Statistics (AISTATS) 2011, Fort Lauderdale, FL, USA. vol. 15 of JMLR: W&CP 15., 9 pages.

Mehra, Pankaj, "Samsung SmartSSD: Accelerating Data-Rich Applications", Samsung Electronics, Flash Memory Summit, Sep. 8, 2018, 9 pages.

Notice of Allowance for U.S. Appl. No. 16/779,086, Mailed Oct. 20, 2021, 9 pages.

Notice of Allowance for U.S. Appl. No. 17/681,512, Mailed Aug. 30, 2023, 9 pages.

Ricco, Jay, "What is max pooling in convolutional neural networks?", downloaded from https://www.quora.com/What-is-max-pooling-in-convolutional-neural-networks, Jun. 15, 2017, 5 pages.

\* cited by examiner

DATA PROCESSING NEAR DATA STORAGE

CROSS-REFERENCE TO RELATED APPLICATION

The present application is a continuation of U.S. patent application Ser. No. 17/681,512, filed Feb. 25, 2022, which is a continuation of U.S. patent application Ser. No. 16/779,086, filed Jan. 31, 2020, and is now U.S. Pat. No. 11,262,954, which claims the benefit of U.S. Provisional Patent Application No. 62/886,498, filed Aug. 14, 2019. The entire specifications of which are hereby incorporated herein by reference in their entirety.

BACKGROUND

Cloud computing leverages distributed computing resources to perform data processing. Batch mode (e.g., offline) processing of data is performed for non-time critical tasks such as tasks that are not subject to completion time requirements such as service level agreements (SLAs). Currently, to run batch mode compute, the data stored in a storage server's solid state drive (SSD) needs to be transferred to a Remote Inference Server to perform processing using a central processing unit (CPU) or inference engines. After all the data processing is completed, the results are sent back to the storage server. Moving large amounts of data for batch mode compute can be very expensive in terms of time spent and energy used and can account for roughly 50-80% of overall energy usage. At the same time, there is need for an additional inference server to run these non-critical compute tasks.

DETAILED DESCRIPTION

Figure 1:
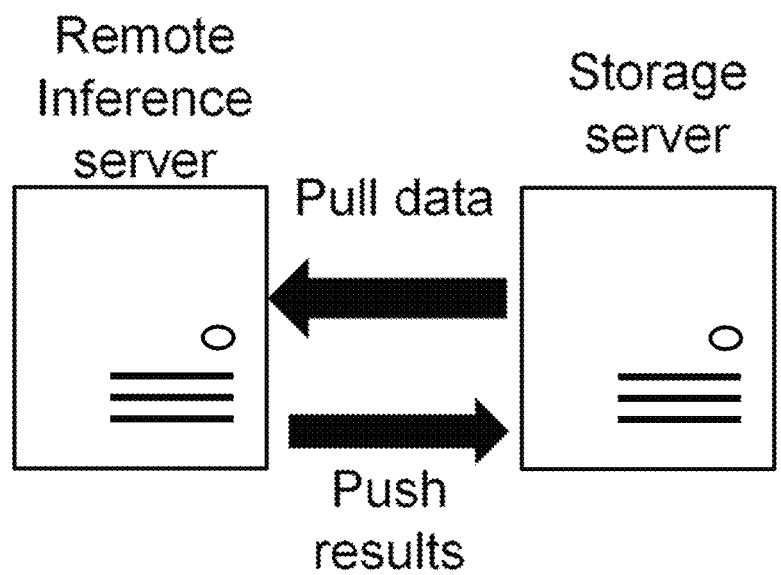
FIG. 1 depicts an example system that uses an inference server in communication with a storage server.

FIG. 1 depicts an example system that uses an inference server in communication with a storage server. As described earlier, in order to perform computations such as machine learning (ML) or artificial intelligence (AI) inferences using data, data from the storage server are copied and sent to the remote inference server using a network or fabric (shown as "Pull data"). The remote inference server performs inference operations or calculations and transmits results to the storage server (shown as "Push results"). However, such system incurs latency in transferring data from a storage server to a remote inference server and providing a result back to the storage server. In addition, power is used in connection with generating and processing packets transmitted between the storage server and remote inference server.

Figure 2:
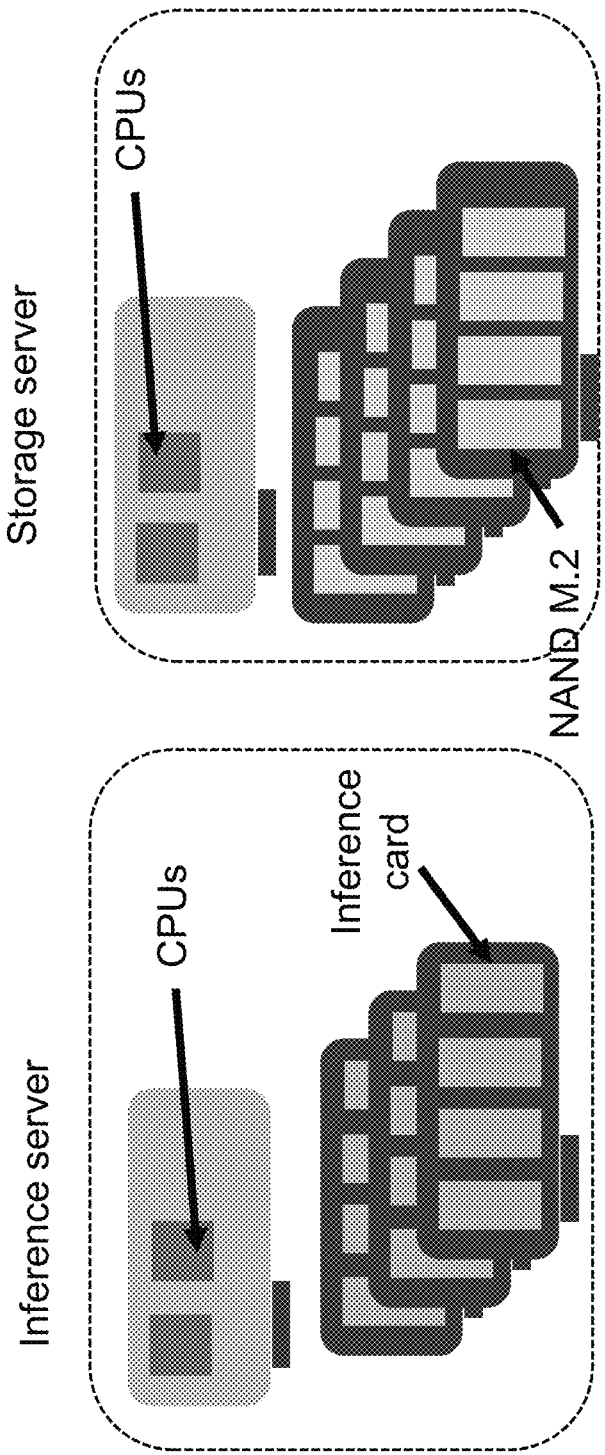
FIG. 2 depicts an example showing separate inference and storage servers.

FIG. 2 depicts a simplified block diagram showing components of separate inference and storage servers. An inference server can include central processing units (CPUs) and inference cards with graphics processing units (GPUs) or field programmable gate arrays (FPGAs) for inference computation. Storage servers can include CPUs and NAND storage devices provided in a server using M.2 compatible form factors. For example, various specifications for M.2 include PCI Express M.2 Specification Revision 3.0, Version 1.2 (2013) and Serial ATA International Organization (SATA-IO) revision 3.2 specification, both of which are incorporated by reference in their entirety.

According to some examples, a server can include both compute (e.g., inference and/or decode) and storage capabilities and data is not transferred to a remote inference server for computation. Data used for inference are typically stored in a storage media using an encoded format such as Joint Photographic Experts Group (JPEG), Portable Network Graphics (PNG), and so forth. The data is encoded to compress the size of data and use less storage resources in the storage media. However, inference engines cannot process encoded data. To run an inference operation with a CPU or inference cards being used as an inference accelerator, the data is fetched from storage solid-state drive (SSD), provided to a CPU, decoded (e.g., JPEG to RGB format) and then stored in static random access memory (SRAM) or dynamic random access memory (DRAM) local to the CPU. Similarly, for performing compute on an SSD, the data needs to be decoded first. Sending data from a storage SSD with inference capability to a CPU or remote device for decoding and then sending decoded data back to the storage SSD with compute capability will be expensive in terms of power and latency (time to completion of an operation).

Figure 3:
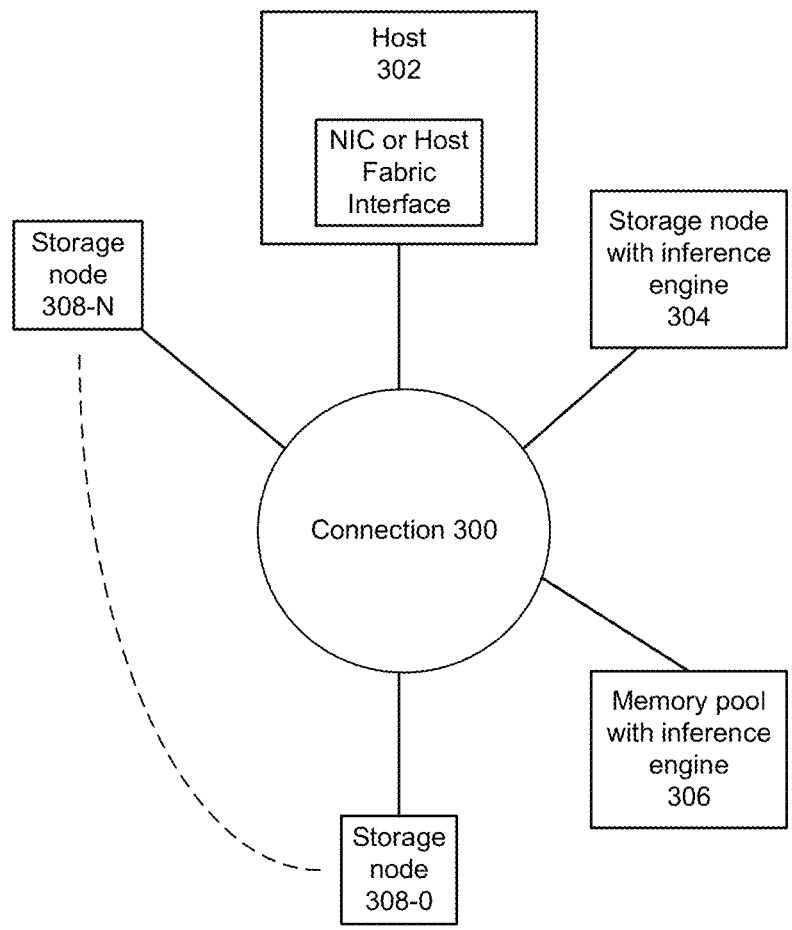
FIG. 3 depicts an example system.

FIG. 3 depicts an example system. Multiple devices can be connected using connection 300. Connection 300 can be a fabric, network, bus or interconnect and can be compatible at least with one or more of: Intel QuickPath Interconnect (QPI), Intel Ultra Path Interconnect (UPI), Intel On-Chip System Fabric (IOSF), Omnipath, Ethernet, Compute Express Link (CXL), HyperTransport, high-speed fabric, PCIe, NVLink, Advanced Microcontroller Bus Architecture (AMBA) interconnect, OpenCAPI, Gen-Z, CCIX, and so forth.

Host device 302 can use a network interface controller (NIC) or host fabric interface (HFI) to access storage node with inference engine 304, memory pool with inference engine 306, or one or more local or remote storage nodes 308-0 to 308-N. In accordance with some embodiments, the storage pools 304 or memory pools 306 can include inference engines and capability to allocate a percentage of bandwidth (e.g., read or write) for memory access associated with a compute command or a storage command (e.g., read or write). An inference engine can be housed in the same device as one or more media in some examples. Various embodiments can be used for any type of machine learning, artificial intelligence, Deep Learning (e.g., convolutional neural network (CNN)), recurrent neural network (RNN)), Non-Deep learning inference, or other types of inference. Von Neumann or non-Von Neumann architectures can be used.

Figure 4:
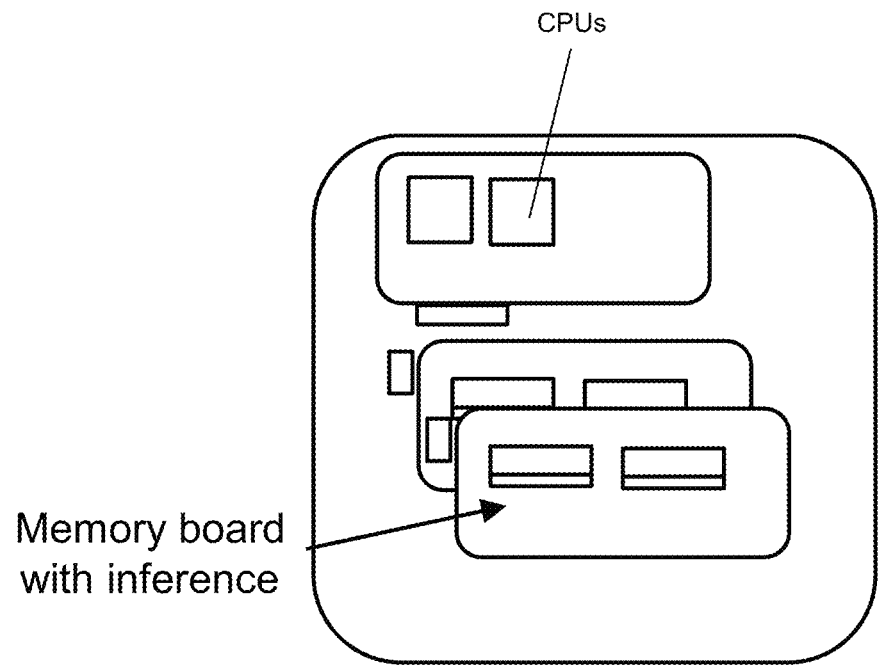
FIG. 4 depicts an example inference and storage server.

FIG. 4 depicts an example inference and storage system. A card with CPUs can be available for use. In addition, a board with memory and inference capabilities is available. The board with memory and inference capabilities can be M.2 compatible. A storage or memory device and inference engine can be mounted using an M.2 compatible circuit board. M.2 is a specification for internally mounted computer expansion cards and associated connectors for coupling to other devices in a server, rack, or blade architecture. Reference to storage or memory device can refer to any type of volatile or non-volatile memory. For example, an N-byte addressable memory device (where N is an integer of 1 or more) can be used. For example, Intel® Optane® can be used. Note that reference to Intel® Optane® can refer to any byte addressable volatile or non-volatile memory device.

Figure 5:
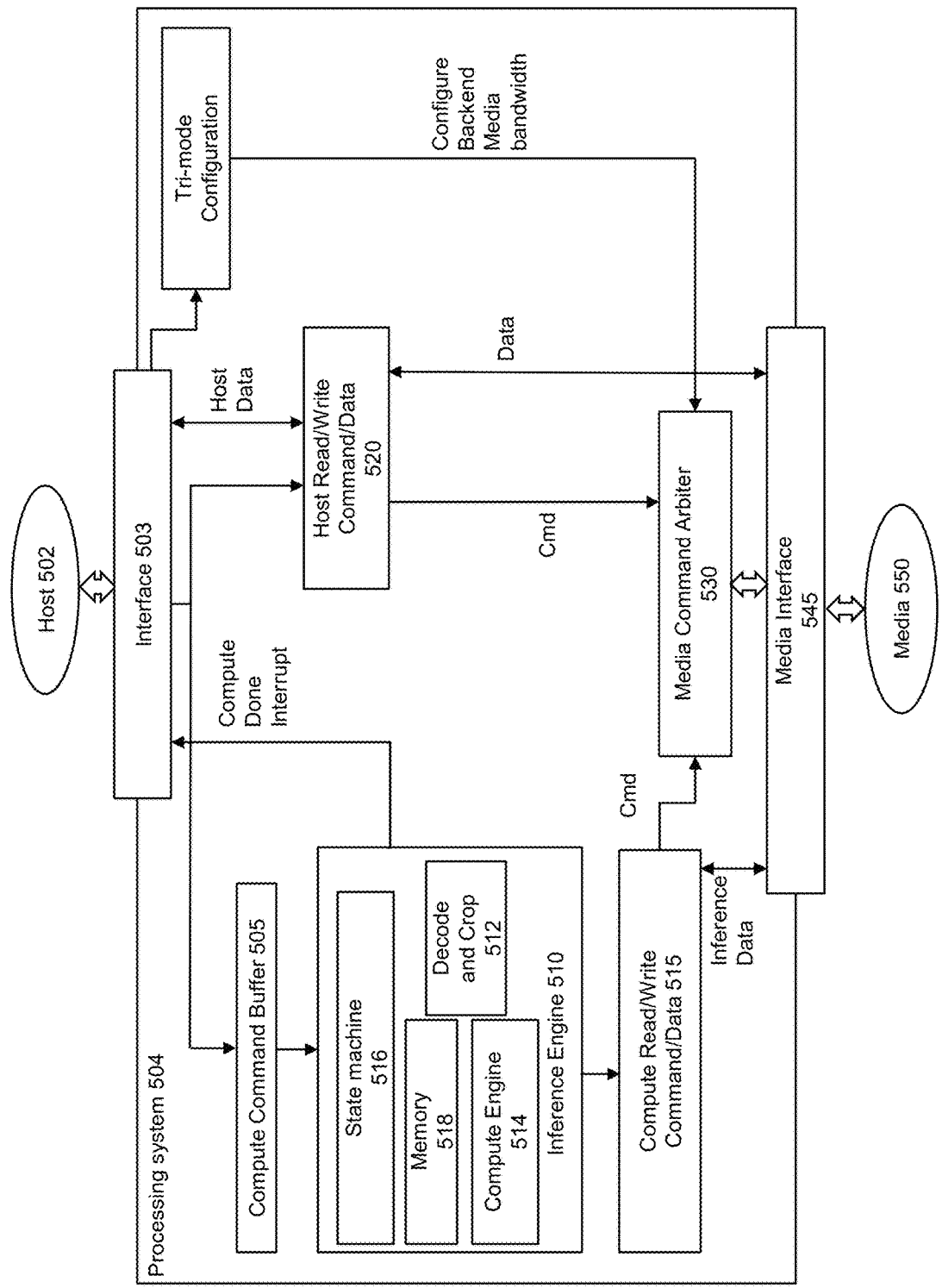
FIG. 5 depicts an example inference and storage server.

FIG. 5 depicts an example inference and storage system. Host system 502 can include any generate purpose processing computing system. For example, host 502 can include one or more processors (e.g., CPU, cores, GPU, accelerators, FPGAs, ASICs, firmware, and so forth) that execute applications and an operating system, virtual machine (VM) or container at the least. Other example components and operation of a host system are described herein for example with respect to FIG. 8. In some examples, host system 502 can be in communication with processing system 504. Processing system 504 can be in communication with one or more local or remote storage or memory devices (shown as media 550). Media 550 can include storage, N-byte addressable memory, volatile memory, cache, 2 level memory (2LM) or any combination thereof. In some examples, an application executed by host 502 or device within host 502 can offload inference or other compute operations to media 550 and host 502 can receive results of the operations from media 550 via processing system 504.

In some examples, processing system 504 can perform inferences or other computation operations on content stored in media 550. For example, processing system 504 can use inference engine 510 to perform inference operations. Inference engine 510 can use one or more of: a decode and crop engine 512, compute engine 514, state machine 516, and memory 518. State machine 516 can control the overall flow of the inference engine 510. State machine 516 can be implemented as a microprocessor for example. When encrypted data is stored in media 550, decode and crop engine 512 can provide for decryption of data read from media 550 or encryption of data before writing data to media 550. Any type of decryption scheme can be supported such as but not limited to National Institute of Standards and Technology (NIST) encryption standard for storage such as the advanced encryption system (AES) XTS algorithm with 128-bit keys. Decode and crop engine 512 can in addition, or alternatively, decompress data stored in media 550. Decompression can include decompressing media (e.g., video, still image, or audio). For example, decompression can convert JPEG to RGB (red, green, and blue) format, and other types of decompression on file types such as but not limited to PNG or MPEG. In some examples, decode and crop engine 512 can perform cropping of image data to isolate a particular region of an image for compute engine 514 to analyze.

By contrast, sending pictures stored in encoded format (e.g., JPEG) via a network or fabric to a remote device for decoding can use more power than sending encoded pictures from media 550 via media interface 545 to a local processing system 504 to decompress. Decoding within or local to media 550 can reduce power use and latency of data availability after processing.

Data provided by decode and crop engine 512 can be stored in memory 518, which is accessible to compute engine 514. Data generated by compute engine 514 can be stored in memory 518 and/or into media 550 for access by the host. Data provided by decode and crop engine 512 can be available for use by compute engine 514 to analyze data and generate inferences to provide at least one or more of: data pattern recognition, image recognition, augmented reality overlay applications, face recognition, object recognition, voice recognition, language translation, and so forth.

Compute engine 514 can provide recommendations such as but not limited to ecommerce (e.g., purchase suggestions), image recognition, distributed file system support (e.g., Lustre, Ceph, Cassandra, redis, Hadoop File System (HDFS)), distributed databases where data is split across servers to access the data pieces. In some cases, to perform inferences, compute engine 514 may process partial data when all data is not available.

Compute engine 514 can use a neural network to perform inferences or analysis. A neural network can be implemented using any or a combination of: one or more hardware components or as program code instructions that are executed on one or more central processing unit (CPU) or cores or graphics processing unit (GPU) processing cores. Inner layers of a neural network can be viewed as layers of neurons that each receive weighted outputs from the neurons of other (e.g., preceding) layer(s) of neurons in a mesh-like interconnection structure between layers. The weight of a connection from the output of a particular preceding neuron to the input of another subsequent neuron is set according to the influence or effect that the preceding neuron is to have on the subsequent neuron. The output value of a preceding neuron can be multiplied by the weight of its connection to the subsequent neuron to determine the particular stimulus that the preceding neuron presents to the subsequent neuron.

A neuron's total input stimulus corresponds to the combined stimulation of all of its weighted input connections. According to various implementations, if a neuron's total input stimulus exceeds some threshold, the neuron is triggered to perform some, e.g., linear or non-linear mathematical function on its input stimulus. The output of the mathematical function corresponds to the output of the neuron which is subsequently multiplied by the respective weights of the neuron's output connections to its following neurons. Neural networks for actual, real-world artificial intelligence and machine learning applications can use large numbers of neurons and large numbers of connections between neurons.

For an artificial intelligence (AI) workload, a model and weights are specified by a compute command. However, weights may not fit into memory 518 and can be accessed from the media 550. Examples of a compute command supported by compute engine 514 include, but are not limited to:

1. Matrix-Matrix Multiply
2. Matrix-Filter Convolve
3. Matrix-Matrix Add/Sub
4. Add/Sub/Mul/Div Matrix with constant
5. Matrix Transpose
6. Apply activation function (ReLU/Sigmoid/Tan h) to Matrix
7. Apply pooling function (Maxpool/Average-pool) to Matrix
8. Apply transcendental operation (Exponent, Logarithmic, Sqrt) to Matrix
9. Batch-normalize matrix
10. Inner-product of vectors
11. Outer-product of vectors
12. Write Column Major Matrix
13. Read Column Major Matrix Various languages and software development kids (SDKs) can be supported such as but not limited to Python, Azure, C++, JavaScript, Java, C #, Julia, Shell, R, TypeScript, Scala, Caffe, Caffe2, ONNX, PyTorch, TensorFlow, Nvidia Deep Learning SDK and CUDA, AMD MIOpen, Intel OpenVINO, Apple Core ML, as well as others.

Inference engine 510 can include application specific integrated circuits (ASICs), Intel processor(s), Advanced RISC Machines (ARM) compatible processor(s), CPUs, GPUs, and other devices.

Description next turns to examples of manners in which host 502 can configure and use processing system 504. Host system 502 can communicate with processing system 504 using an interface 503. Interface 503 can be any type of bus, interconnect, fabric interface, or network interface. Host system 502 can configure processing system 504 to allocate a certain percentage of output and/or input bandwidth allocated for communication with media 550. For example, media 550 can represent one or more devices that are locally accessible to processing system 504 using interface 545 or remotely accessible using a network or fabric. Media interface 545 provides an interface between processing system 504 and media 550. Media interface 545 can include a fabric or network interface and can issue and receive communications compatible with NVMe-oF to access remote memory or storage devices. Non-volatile Memory Express over Fabrics (NVMe-oF) is described for example at least in NVM Express, Inc., "NVM Express Over Fabrics," Revision 1.0, Jun. 5, 2016, and variations and revisions thereof. Media interface 545 can be compatible with one or more of: DDR4, DDR5, PCIe or any interconnect or bus standard such as, but not limited to those described herein. In some examples, processing system 504 is connected to media device 550 via traces on a motherboard or circuit board. In some examples, processing system 504 can be housed in the same physical casing as that of media device 550 or a different physical casing than that around media device 550.

Host system 502 can issue a Tri-mode configuration to processing system 504. The Tri-mode configuration is handled by backend media command arbiter 530 by maintaining pipelines for solid state drive (SSD) Read/Write operations and compute-related Read/Write operations. Media command arbiter 530 will accept command from pipelines based on a Tri-mode configuration. Tri-mode configuration permits a host 502 or other entity (e.g., orchestrator or hypervisor) to configure processing system 504 to operate in compute only mode, storage only mode, or compute and storage mode. In some examples, an application or end user can access an application program interface (API) to configure output and/or input bandwidth of media 550 allocated to command or storage commands. For a compute only mode, media command arbiter 530 can accept and perform commands from a compute pipeline. For storage only mode, media command arbiter 530 can accept commands and perform from a storage pipeline. For mixed compute and storage commands, media command arbiter 530 can accept and perform commands from a storage pipeline and a compute pipeline.

Processing system 504 can be configured in tri-mode capability to permit operation in three different modes can allow a data center to maximally utilize their hardware resources based on demand of service. For example, in a first mode, at peak SSD usage times or where storage resources are fully utilized or overutilized, 100% media bandwidth can be provided to byte addressable media SSD for read or write operations and no computation performance using processing system 504. In a second mode, in non-peak SSD usage times or where storage bandwidth is sufficiently available, up to 100% of media bandwidth can be allocated for compute-related operations. In a third mode, some non-zero amount of storage bandwidth is allocated to compute-related operations involving media 550 and some non-zero amount of storage bandwidth is allocated to storage-related operations involving media 550.

For compute and storage modes, media command arbiter 530 can accept commands from compute or storage pipelines based on a configured permitted bandwidth. For example, an output bandwidth from media 550 to media interface 545 can be set at X % of bandwidth for compute commands and 100*(1−(X/100))% for storage commands, where $0 \leq X \leq 100$. For example, an input bandwidth from media interface 545 to media 550 can be set at Y % of bandwidth for compute commands and 100*(1−(Y/100))% for storage commands, where $0 \leq Y \leq 100$. Other configurations can be used.

In some examples, compute and storage commands that are permitted to be transferred to media 550 for memory access operations over a time period or number of requests. For example, out of 10 consecutive requests, A can be zero or more compute commands and 10-A can be zero or more storage commands, where $0 \leq A \leq 10$.

In some examples, where media 550 includes SSDs 1-8, SSDs 1-4 can be allocated for use by compute commands or SSDs 5-8 can be allocated for use by storage commands.

Host 502 can issue a compute or storage command to processing system 504. A storage command (e.g., read or write) can be directed to a logical device address allocated for storage operations. For example, a logical device address of 00 can correspond to a storage command and interface 503 directs storage commands to host read/write command/data block 520. Host read/write command/data block 520 can queue storage commands and prioritize which storage command to transfer to media command arbiter 530 based on an applicable prioritization policy.

A compute command (e.g., read and compute) can be directed to a logical device address allocated for a command. The compute command can include or be associated with an inference model (e.g., model type) and include or reference weights stored in media 550. For example, a logical device address of 01 can correspond to a compute command. Compute command block 505 can queue compute commands to be provided to inference engine 510. Compute command block 505 can apply quality of service (QoS) to prioritize transfer of compute commands to inference engine 510 for execution based on applicable policies.

An example routine for performing queued compute commands from host 502 is shown next.

```
While compute tasks not done {
    Compute Command with address to model and
    data stored in Storage Media
    Wait until Compute is done
}
```

Compute read/write command/data block 515 can provide a queue for compute commands and data prior to transfer to media command arbiter 530 or media interface 545.

Media command arbiter 530 can enforce input and/or output bandwidth allocated for communication with media 550 as configured by host 502 or some other device (e.g., orchestrator, pod manager, administrator, and so forth). Media command arbiter 530 can receive data access requests (e.g., write or read) associated with compute commands from compute read/write command/data 515 and storage commands (e.g., write or read) from host read/write command/data block 520. Media command arbiter 530 can decide whether to egress a memory access for a compute command or storage command based on configured output and/or input bandwidth policies described earlier. For memory accesses for compute commands, the commands egressed to media 550 can include a read of data and/or weights or a write of processed data or results to media 550. For storage commands, the commands egressed to media 550 can include read data from media 550 or data to write to media 550.

Accordingly, bandwidth allocated to a compute command can include read of data from media 550 or writing of data to media 550. Bandwidth allocated to storage commands can be associated with data read from media 550 or data to write to media 550. Data can refer to any type of content such as one or more of: encrypted content, decrypted content, encoded content, decoded content, weights, inferences, instructions, commands and so forth. In some examples, input and output bandwidth to and from media 550 can be separately allocated for a mode. For example, for a storage and compute mode: for storage commands, some percentage of input bandwidth to media 550 and output bandwidth from media 550 can be allocated. For compute commands, some percentage of input bandwidth to media 550 and output bandwidth from media 550 can be allocated.

Requests for a storage command may not be permitted to be transferred to media 550 due to bandwidth restrictions and requests can be queued or blocked. Conversely, in a case where requests for a compute command is not permitted to transfer to media 550 due to bandwidth restrictions, the compute command is queued or blocked.

After a compute operation is completed and a result is available, inference engine 510 can indicate to host 502, through interface 503, that a compute operation is complete via interrupt or other message or signal. In response, host 502 can issue a storage command to read results from media 550. In some examples, the storage command to read results from media can receive priority over other compute and storage commands or even in cases where 100% of bandwidth allocation is to compute.

As stated earlier, media 550 can include one or more memory or storage devices. For example, memory or storage devices can include a byte-addressable write-in-place three dimensional cross point memory device, or N-byte addressable write-in-place memory device (also referred to as persistent memory), such as single or multi-level Phase Change Memory (PCM) or phase change memory with a switch (PCMS), devices that use chalcogenide phase change material (for example, chalcogenide glass), and/or resistive memory including metal oxide base. A write-in-place memory device can permit writing one or more bytes of memory directly to the device. Note that reference to byte addressable memory or byte addressable write-in-place memory can refer to N-byte addressable memory or N-byte addressable write-in-place memory, where N is an integer of 1 or more.

Various embodiments of media 550 use at least two levels of memory ("2LM") that includes cached subsets of system disk or SSD-level storage (in addition to, for example, run-time data). This main memory includes a first level (alternatively referred to herein as "near memory") including smaller faster memory made of, for example, DRAM or other volatile memory; and a second level (alternatively referred to herein as "far memory") which includes larger and slower (with respect to the near memory) volatile memory (e.g., DRAM) or nonvolatile memory storage (e.g., flash memory or byte addressable non-volatile memory (e.g., Intel Optane® or Samsung Z-NAND®)). The far memory is presented as "main memory" to the host operating system (OS), while the near memory is a cache for the far memory that is transparent to the OS, thus rendering the embodiments described below to appear the same as prior art main memory solutions. The management of the two-level memory may be done by a combination of logic and modules executed via the host central processing unit (CPU). Near memory may be coupled to the host system CPU via high bandwidth, low latency means for efficient processing. Far memory may be coupled to the CPU via low bandwidth, high latency means (as compared to that of the near memory).

Note that in some cases where storage is a NAND-type that is block addressable (e.g., 4-8 kilobytes), retrieval of data for processing can be too coarse as the data requested may be much less than a block worth of data. By contrast, byte addressable memory allows byte-level addressability and accessibility of data. For a read operation, a page of NAND accessed by a read can be 16 kilobytes compared to a 16 byte read for Intel® Optane® or other byte addressable memory such as write-in-place memory. In Intel® Optane®, 16 bytes of data can be written without need for read, modify, and write operations associated with NAND.

Data on which inference is to be performed is usually more fine-grained than a block level. For example, a convolutional neural network (CNN) uses small amounts of data with matrices of varying shapes so block level accesses (reads) can be too coarse and result in throwing away too much data. Byte addressability allows for more efficient and faster data access.

The following provides an example embodiment. Compute commands will be accepted by processing system 504, which is a part of media 550. For example, an Intel® Optane® SSD device can also include a connected processing system 504. A received compute command can include or refer to an operation such as Convolution, Relu, MaxPool, and any other machine language related operations and refer to addresses of inference data and inference model. The inference data and inference model may be stored in media 550. After a command is received by processing system 504, processing system 504 will in turn issue an N-byte addressable read command to fetch data and a model from media 550. An inference read command and inference model read command will be arbitrated through media command arbiter 530 such that output bandwidth from media 550 to processing system 504 is allocated for the read operation subject to bandwidth configuration described earlier.

After the data and model are received by processing system 504, processing system 504 will execute the operation (e.g., Convolution, Relu, MaxPool). For example, Convolution can refer to application of a filter to an input that results in an activation. Repeated application of the same filter to an input results in a map of activations called a feature map, indicating the locations and strength of a detected feature in an input, such as an image. Relu can refer to Rectified Linear Units and can be described at least in Xavier Glorot, Antoine Bordes, Yoshua Bengio, "Deep Sparse Rectifier Neural Networks," 14th International Conference on Artificial Intelligence and Statistics, April 2011, Fort Lauderdale, United States, pp. 315-323. MaxPool can refer to a sample-based discretization process that attempts to down-sample an input representation (e.g., image, hidden-layer output matrix, and so forth), reducing its dimensionality and allowing for assumptions to be made about features contained in the sub-regions binned. The result of the operation can be written to media 550 in an Optane® SSD or other byte addressable media. After writing the result to media 550, processing system 504 issues an inference complete indication to host 502 through interface 503. After receiving the inference done indication, host 502 can issue another command such as to retrieve the result or perform further processing on the result.

Various advantages of some embodiments, but not necessary features, include any or none of the following. Compute in a byte addressable media SSD for batch mode inference can reduce the data transfer energy expended to copy data to a device that processes the data and reduce need for separate inference server or process running on a separate server. Adding decode capability in a byte addressable media SSD can avoid the data being to be sent to host for a decode operation, which saves data movement energy and hence achieve a higher Tensor Operations Per Second (TOPS) per watt (unit of power).

Figure 6A:
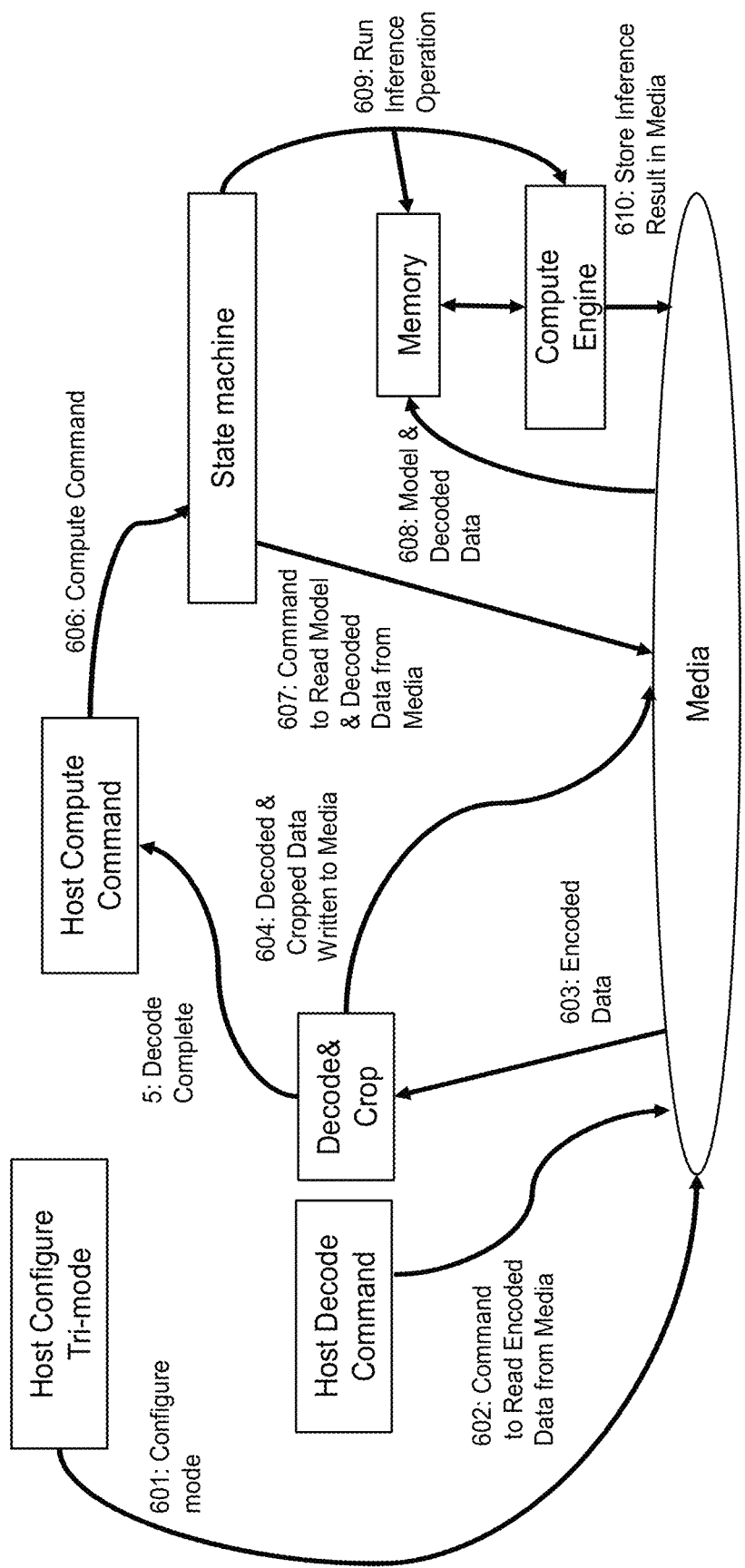
FIGS. 6A-6C depict processes.

FIG. 6A depicts a state diagram. At 601, a host configures bandwidth of media (e.g., byte addressable media) for one of the modes: compute-only mode, storage-only mode, or compute and storage mode. At 602, the host issues a Decode Command to a processing system that processes commands provided to the media. The Decode Command refers to an address of data in the media device. The Decode Command leads to a read of encoded data (e.g., a media file or encrypted file) from the media and copying of the encoded data into decoder engine of the processing system. At 603, the decoder engine decodes, decrypts or crops the data and stores the resulting data into a memory. At 604, the processing system copies the decoded and (optionally) cropped data from memory to the media. At 605, the processing system sends an interrupt or message to the host that a decode task is complete.

At 606, the host issues a compute command with an address in the media of an inference model (e.g., weights) and an address of the decoded data (to be processed using the inference model) to a state machine of a processing system. At 607, the state machine issues a Read command for an inference model (and optionally, weights) and decoded data from the media. At 608, the processing system copies the model and decoded data from media into local memory (e.g., SRAM). At 609, the compute engine runs a compute of inference operation over the data using the copied inference model and data. At 610, after the compute or inference operation is completed, generated data is stored into the media and available for access or subsequent processing. For example, the host can issue another command to process the data or to retrieve the data for transmission to another device.

Figure 6B:
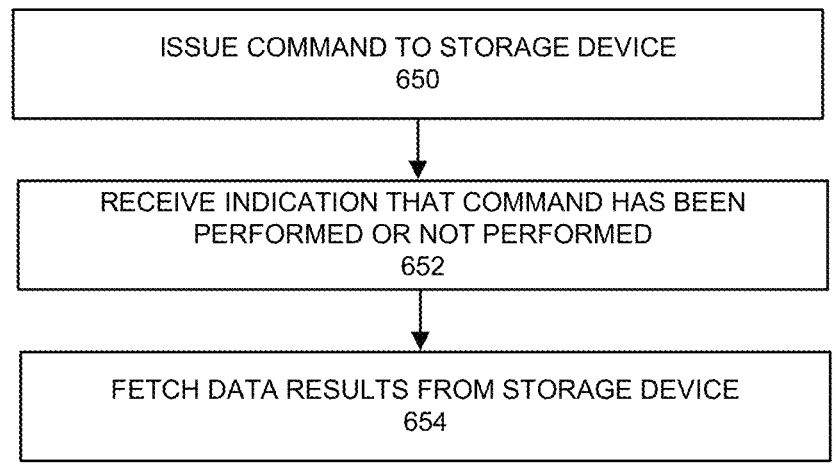

FIG. 6B depicts a process that can be performed by a host device to request performance of an operation by a byte addressable storage device with local compute capability. At 650, an application executed by the host device generates a command for performance by a byte addressable storage device with local compute capability. The application can offload performance of the command to the byte addressable storage device with local compute capability. The command is transferred to the byte addressable storage device with local compute capability, via a local interface (e.g., interconnect or bus), network, or fabric. In some examples, instead or in addition to an application making a request for performance of an operation, a device (e.g., accelerator, GPU, or other hardware device) can request performance of an operation by byte addressable storage device with local compute capability.

A command can request performance of inferences based on analysis of data to provide at least one or more of: data pattern recognition, image recognition, augmented reality overlay images, face recognition, object recognition, voice recognition, language translation, and so forth. Byte addressable storage device with local compute capability can use a neural network to perform inferences or analysis.

At 652, an indication is received that the command has been performed. The byte addressable storage device with local compute capability can issue the indication via an interrupt or a message sent to the host device using an interface protocol. However, in some cases, such as if an applicable allocation of storage and compute commands or policy does not permit the command to be performed, an indication is received that the command was not performed. For example, in some examples, the storage device with local compute capability can be configured to only perform read or write commands to the storage media and no compute operations. In such case, the command may not be performed and an indication is provided to the host device that the command was not performed. In other examples, if the storage device with local compute capability is configured to only perform read or write commands to the storage media and no compute operations, the command can be enqueued for performance when the storage device with local compute capability is configured to allow performance of a compute operation.

In some examples, the issuer of the command may not be permitted to use the compute feature or the storage media due to lack of permission or overuse of allocated compute or storage resources. In such case, the command may not be performed and an indication is provided to the host device that the command was not performed.

At 654, the results of the performance of the command can be fetched from the storage device. For example, the host system can request and retrieve data generated from a prior compute operation using the local interface (e.g., interconnect or bus), network, or fabric. The prior compute operation could have been requested by the same host device that requests the retrieval or a different device than that which requests the data retrieval. For example, service chaining can be applied where one device processes data and stores processed results into the memory and another device accesses the results from the memory.

Figure 6C:
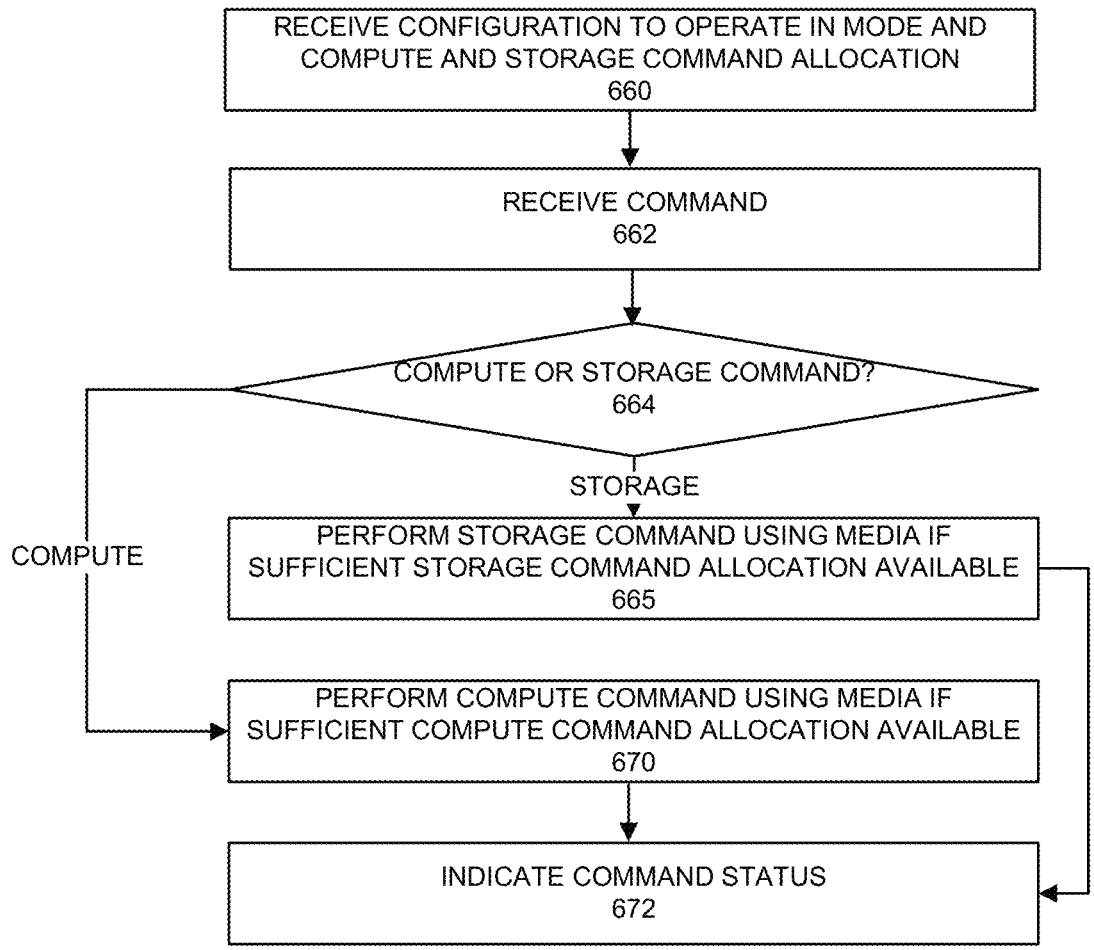

FIG. 6C depicts a process that can be performed by a storage device with compute capability. The storage device with compute capability can include a byte addressable storage media. At 660, a configuration is received for the storage device with compute capability to operate in one of: a storage mode, compute mode, or storage and compute mode. For storage mode and compute mode, a command and/or bandwidth allocation can be provided. Non-limiting examples of allocation of compute commands can be: permitted number of compute commands over time, permitted number of number of compute commands, or allocated input or output bandwidth for compute commands to or from the media. Non-limiting examples of allocation of storage commands can be: permitted number of storage commands over time, permitted number of number of storage commands, or allocated input or output bandwidth for storage commands to or from the media.

At 662, a command can be received. The command can be a storage command or compute command. The command can be received from a locally attached host device or a device connected through a network or fabric to the storage device with compute capability.

At 664, a determination is made as to whether the command is a storage command or compute command. If the command is a storage command and permitted to be performed under the applicable allocation of compute and storage commands, then 665 follows where a storage command involving the media can be performed (e.g., read or write). The command can be queued to follow any prior storage or compute commands that were received. In some examples, prioritization of commands is provided such that a command indicates a priority level and the command can be placed ahead of lower priority level compute or storage commands received earlier in time by the storage device with compute capability. Performance of the command can occur subject to performance or bandwidth restrictions set in 660.

If the command is a compute command and permitted to be performed under the applicable allocation of compute and storage commands, then 670 follows. At 670, the command can be performed using the compute engine. As stated earlier, non-limiting examples of performance of the command include performance of any of inferences based on analyzed data to provide at least: data pattern recognition, image recognition, augmented reality image overlay, face recognition, object recognition, voice recognition, language translation, and so forth. The compute engine can use a neural network to perform inferences or analysis.

If a command cannot be performed given the applicable compute and storage command allocation, the command can be queued for execution when permitted under the applicable allocation.

At 672, an indication of command status can be provided to the requester. For example, a message or interrupt can be generated to inform the requester (e.g., application) of availability of results or data in the case of a compute command that is permitted to be performed. If a command is a storage command and is permitted to be performed, an indication of completion of storage of data can be provided to the requester. In some cases, if a command cannot be performed given the applicable compute and storage command configuration or other reasons (e.g., requester is not permitted to use inference engine), a negative acknowledgement can be provided to the requester to indicate the command was not performed.

Figure 7A:
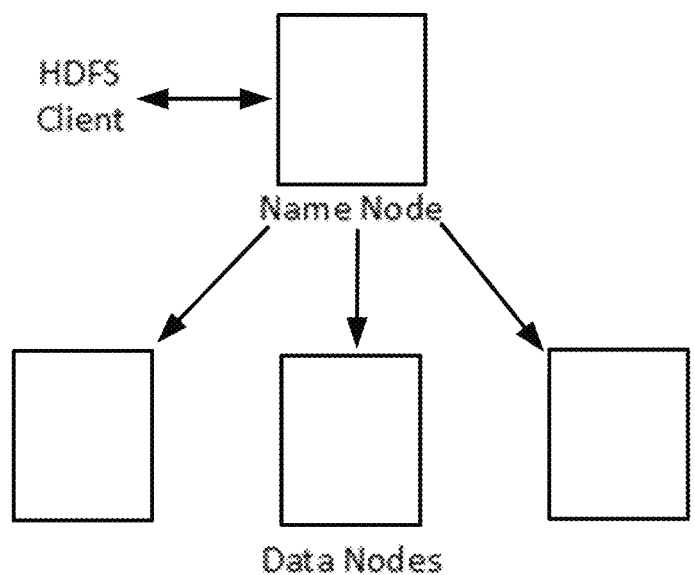
FIGS. 7A-7C depict an example use scenario.

FIG. 7A depicts a Hadoop Filesystem (HDFS) architecture. HDFS is a distributed file system that is highly fault-tolerant. HDFS provides high throughput access to application data and is suitable for applications that have large data sets. A version of HDFS is an Apache Hadoop project. The HDFS architecture follows a Master/Follower Architecture where a cluster comprises of single Name Node (Master Node) and all other nodes are Data Nodes (Follower Nodes). The Master Node maintains and manages the file system that is distributed in the Data Nodes. The Data Nodes store the data.

Figure 7B:
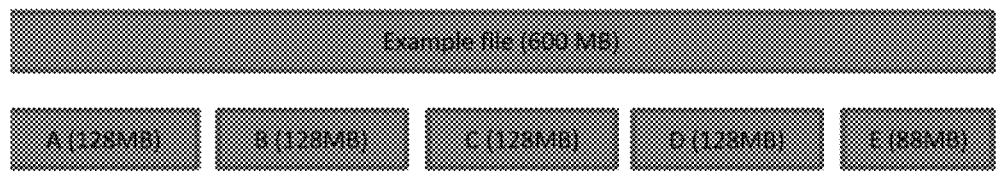

FIG. 7B depicts an example of a file broken into "blocks" and scattered across several Data Nodes. The block size is generally preconfigured in the system. FIG. 7B shows an example of a file that is broken down into blocks of size (e.g., 128 MB, although other sizes can be used). These blocks will be scattered across several Data Nodes and are managed by the Name Node. Dual mode SSDs in the Data Nodes can act as micro inference engines and operate on the "blocks" of data that reside in the media. The command/data flow is described below. In some examples, a Data Node can use a processing system and media described herein.

Figure 7C:
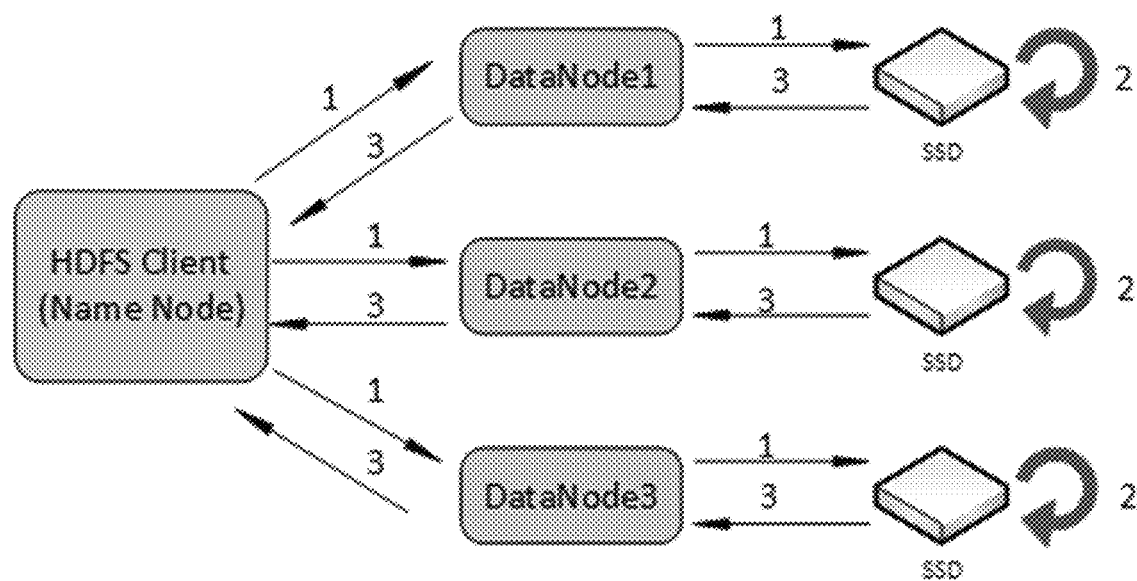

FIG. 7C depicts an inference CMD and DATA flow. An HDFS client can send requests to multiple HDFS Data Nodes (e.g. Data Nodes1-3). An HDFS data node can use an SSD in accordance with embodiments described herein to perform inference processing. For example, the client can transact with any Data Node using (1) to (3) described next. At (1), a client issues an inference command (Cmd) on a complete data set. A Name Node identifies the Data Nodes that store the data set. The client issues an inference Cmd and identifies an address of weights in a Data Node or provides weights to the relevant Data Nodes. The Data Nodes uses a processing system to configure an interference engine with weights and issues a command to fetch weights and data from the SSD. The SSD in some examples can include an N-byte addressable memory.

At (2), the Inference Engine (IE) within the SSD performs inference on a local data set at the SSD. The IE is configured with the weights used for an inference phase. The IE executes inference using the local data blocks in its local media of the Data Node. The IE creates results as data blocks and stores the data blocks in its local media of the Data Node.

At (3), the IE/SSD sends an Acknowledge (Ack) to the Name Node when a job is complete. The packet or message that conveys the Ack can reference or inference result data blocks in a Data Node so that the inference data generated by an inference engine can be stored in a Data Node that also stored the source data used to perform an inference. At (5), the HDFS client can read the result blocks using standard HDFS reads.

Figure 8:
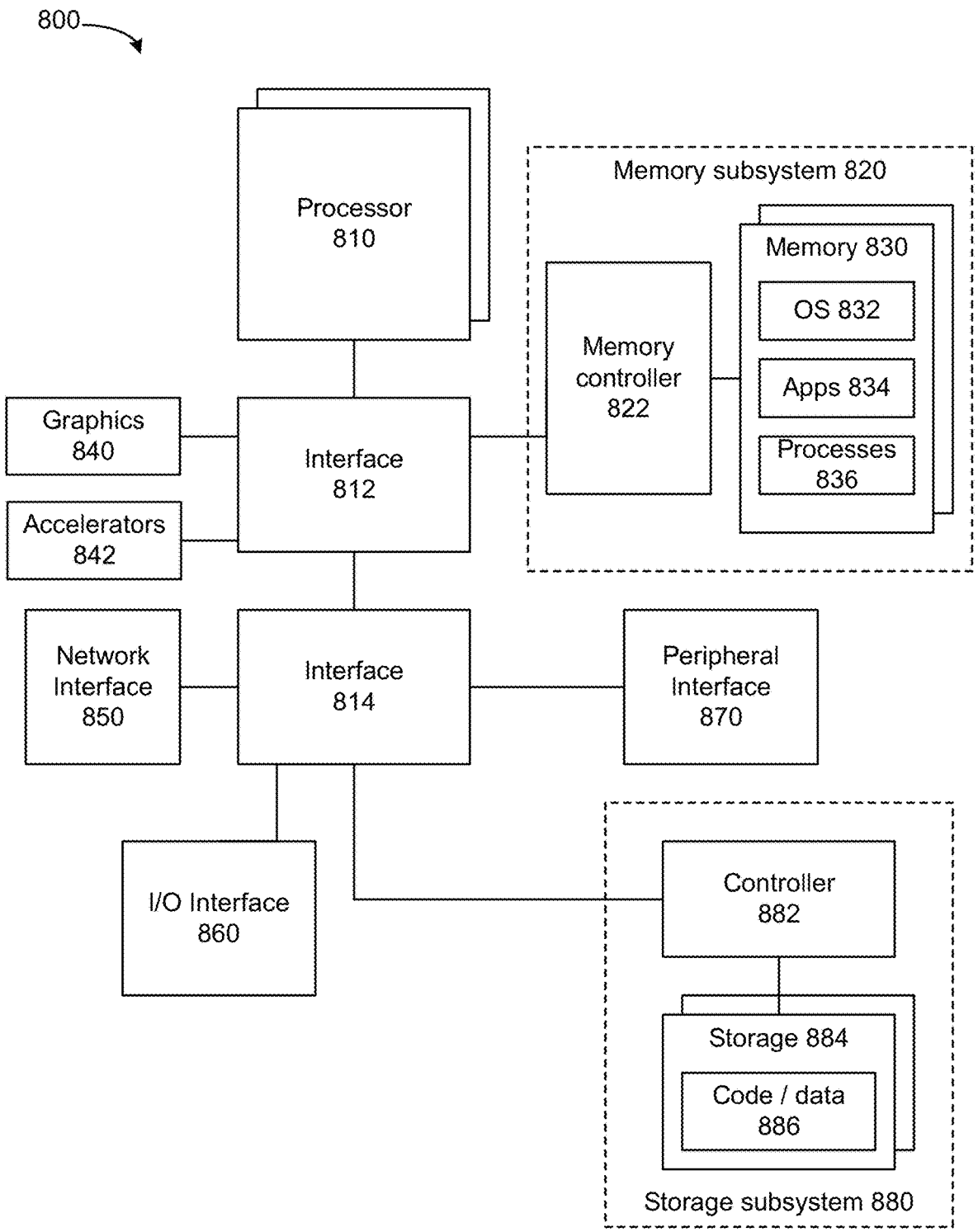
FIG. 8 depicts a system.

FIG. 8 depicts an example system. The system can use embodiments described herein to offload computation to a storage device that uses byte-address non-volatile memory. System 800 includes processor 810, which provides processing, operation management, and execution of instructions for system 800. Processor 810 can include any type of microprocessor, central processing unit (CPU), graphics processing unit (GPU), processing core, or other processing hardware to provide processing for system 800, or a combination of processors. Processor 810 controls the overall operation of system 800, and can be or include, one or more programmable general-purpose or special-purpose microprocessors, digital signal processors (DSPs), programmable controllers, application specific integrated circuits (ASICs), programmable logic devices (PLDs), or the like, or a combination of such devices.

In one example, system 800 includes interface 812 coupled to processor 810, which can represent a higher speed interface or a high throughput interface for system components that needs higher bandwidth connections, such as memory subsystem 820 or graphics interface components 840, or accelerators 842. Interface 812 represents an interface circuit, which can be a standalone component or integrated onto a processor die. Where present, graphics interface 840 interfaces to graphics components for providing a visual display to a user of system 800. In one example, graphics interface 840 can drive a high definition (HD) display that provides an output to a user. High definition can refer to a display having a pixel density of approximately 100 PPI (pixels per inch) or greater and can include formats such as full HD (e.g., 1080p), retina displays, 4K (ultra-high definition or UHD), or others. In one example, the display can include a touchscreen display. In one example, graphics interface 840 generates a display based on data stored in memory 830 or based on operations executed by processor 810 or both. In one example, graphics interface 840 generates a display based on data stored in memory 830 or based on operations executed by processor 810 or both.

Accelerators 842 can be a fixed function offload engine that can be accessed or used by a processor 810. For example, an accelerator among accelerators 842 can provide compression (DC) capability, cryptography services such as public key encryption (PKE), cipher, hash/authentication capabilities, decryption, or other capabilities or services. In some embodiments, in addition or alternatively, an accelerator among accelerators 842 provides field select controller capabilities as described herein. In some cases, accelerators 842 can be integrated into a CPU socket (e.g., a connector to a motherboard or circuit board that includes a CPU and provides an electrical interface with the CPU). For example, accelerators 842 can include a single or multi-core processor, graphics processing unit, logical execution unit single or multi-level cache, functional units usable to independently execute programs or threads, application specific integrated circuits (ASICs), neural network processors (NNPs), programmable control logic, and programmable processing elements such as field programmable gate arrays (FPGAs).

Accelerators 842 can provide multiple neural networks, CPUs, processor cores, general purpose graphics processing units, or graphics processing units can be made available for use by artificial intelligence (AI) or machine learning (ML) models. For example, the AI model can use or include any or a combination of: a reinforcement learning scheme, Q-learning scheme, deep-Q learning, or Asynchronous Advantage Actor-Critic (A3C), combinatorial neural network, recurrent combinatorial neural network, or other AI or ML model. Multiple neural networks, processor cores, or graphics processing units can be made available for use by AI or ML models.

Memory subsystem 820 represents the main memory of system 800 and provides storage for code to be executed by processor 810, or data values to be used in executing a routine. Memory subsystem 820 can include one or more memory devices 830 such as read-only memory (ROM), flash memory, one or more varieties of random access memory (RAM) such as DRAM, or other memory devices, or a combination of such devices. Memory 830 stores and hosts, among other things, operating system (OS) 832 to provide a software platform for execution of instructions in system 800. Additionally, applications 834 can execute on the software platform of OS 832 from memory 830. Applications 834 represent programs that have their own operational logic to perform execution of one or more functions. Processes 836 represent agents or routines that provide auxiliary functions to OS 832 or one or more applications 834 or a combination. OS 832, applications 834, and processes 836 provide software logic to provide functions for system 800. In one example, memory subsystem 820 includes memory controller 822, which is a memory controller to generate and issue commands to memory 830. It will be understood that memory controller 822 could be a physical part of processor 810 or a physical part of interface 812. For example, memory controller 822 can be an integrated memory controller, integrated onto a circuit with processor 810.

While not specifically illustrated, it will be understood that system 800 can include one or more buses or bus systems between devices, such as a memory bus, a graphics bus, interface buses, or others. Buses or other signal lines can communicatively or electrically couple components together, or both communicatively and electrically couple the components. Buses can include physical communication lines, point-to-point connections, bridges, adapters, controllers, or other circuitry or a combination. Buses can include, for example, one or more of a system bus, a Peripheral Component Interconnect (PCI) bus, a Hyper Transport or industry standard architecture (ISA) bus, a small computer system interface (SCSI) bus, a universal serial bus (USB), or an Institute of Electrical and Electronics Engineers (IEEE) standard 1394 bus (Firewire).

In one example, system 800 includes interface 814, which can be coupled to interface 812. In one example, interface 814 represents an interface circuit, which can include stand-alone components and integrated circuitry. In one example, multiple user interface components or peripheral components, or both, couple to interface 814. Network interface 850 provides system 800 the ability to communicate with remote devices (e.g., servers or other computing devices) over one or more networks. Network interface 850 can include an Ethernet adapter, wireless interconnection components, cellular network interconnection components, USB (universal serial bus), or other wired or wireless standards-based or proprietary interfaces. Network interface 850 can transmit data to a device that is in the same data center or rack or a remote device, which can include sending data stored in memory. Network interface 850 can receive data from a remote device, which can include storing received data into memory. Various embodiments can be used in connection with network interface 850, processor 810, and memory subsystem 820.

In one example, system 800 includes one or more input/output (I/O) interface(s) 860. I/O interface 860 can include one or more interface components through which a user interacts with system 800 (e.g., audio, alphanumeric, tactile/touch, or other interfacing). Peripheral interface 870 can include any hardware interface not specifically mentioned above. Peripherals refer generally to devices that connect dependently to system 800. A dependent connection is one where system 800 provides the software platform or hardware platform or both on which operation executes, and with which a user interacts.

In one example, system 800 includes storage subsystem 880 to store data in a nonvolatile manner. In one example, in certain system implementations, at least certain components of storage 880 can overlap with components of memory subsystem 820. Storage subsystem 880 includes storage device(s) 884, which can be or include any conventional medium for storing large amounts of data in a nonvolatile manner, such as one or more magnetic, solid state, or optical based disks, or a combination. Storage 884 holds code or instructions and data 886 in a persistent state (i.e., the value is retained despite interruption of power to system 800). Storage 884 can be generically considered to be a "memory," although memory 830 is typically the executing or operating memory to provide instructions to processor 810. Whereas storage 884 is nonvolatile, memory 830 can include volatile memory (i.e., the value or state of the data is indeterminate if power is interrupted to system 800). In one example, storage subsystem 880 includes controller 882 to interface with storage 884. In one example controller 882 is a physical part of interface 814 or processor 810 or can include circuits or logic in both processor 810 and interface 814.

A volatile memory is memory whose state (and therefore the data stored in it) is indeterminate if power is interrupted to the device. Dynamic volatile memory requires refreshing the data stored in the device to maintain state. One example of dynamic volatile memory incudes DRAM (Dynamic Random Access Memory), or some variant such as Synchronous DRAM (SDRAM). A memory subsystem as described herein may be compatible with a number of memory technologies, such as DDR3 (Double Data Rate version 3, original release by JEDEC (Joint Electronic Device Engineering Council) on Jun. 27, 2007). DDR4 (DDR version 4, initial specification published in September 2012 by JEDEC), DDR4E (DDR version 4), LPDDR3 (Low Power DDR version3, JESD209-3B, August 2013 by JEDEC), LPDDR4) LPDDR version 4, JESD209-4, originally published by JEDEC in August 2014), WIO2 (Wide Input/output version 2, JESD229-2 originally published by JEDEC in August 2014, HBM (High Bandwidth Memory, JESD325, originally published by JEDEC in October 2013, LPDDR5 (currently in discussion by JEDEC), HBM2 (HBM version 2), currently in discussion by JEDEC, or others or combinations of memory technologies, and technologies based on derivatives or extensions of such specifications. The JEDEC standards are available at www.jedec.org.

A non-volatile memory (NVM) device is a memory whose state is determinate even if power is interrupted to the device. In one embodiment, the NVM device can comprise a block addressable memory device, such as NAND technologies, or more specifically, multi-threshold level NAND flash memory (for example, Single-Level Cell ("SLC"), Multi-Level Cell ("MLC"), Quad-Level Cell ("QLC"), Tri-Level Cell ("TLC"), or some other NAND). A NVM device can also comprise a byte-addressable write-in-place three dimensional cross point memory device, or other byte addressable write-in-place NVM device (also referred to as persistent memory), such as single or multi-level Phase Change Memory (PCM) or phase change memory with a switch (PCMS), NVM devices that use chalcogenide phase change material (for example, chalcogenide glass), resistive memory including metal oxide base, oxygen vacancy base and Conductive Bridge Random Access Memory (CB-RAM), nanowire memory, ferroelectric random access memory (FeRAM, FRAM), magneto resistive random access memory (MRAM) that incorporates memristor technology, spin transfer torque (STT)-MRAM, a spintronic magnetic junction memory based device, a magnetic tunneling junction (MTJ) based device, a DW (Domain Wall) and SOT (Spin Orbit Transfer) based device, a thyristor based memory device, or a combination of any of the above, or other memory.

A power source (not depicted) provides power to the components of system 800. More specifically, power source typically interfaces to one or multiple power supplies in system 800 to provide power to the components of system 800. In one example, the power supply includes an AC to DC (alternating current to direct current) adapter to plug into a wall outlet. Such AC power can be renewable energy (e.g., solar power) power source. In one example, power source includes a DC power source, such as an external AC to DC converter. In one example, power source or power supply includes wireless charging hardware to charge via proximity to a charging field. In one example, power source can include an internal battery, alternating current supply, motion-based power supply, solar power supply, or fuel cell source.

In an example, system 800 can be implemented using interconnected compute sleds of processors, memories, storages, network interfaces, and other components. High speed interconnects can be used such as any network, fabric, or interconnect that comply with one or more of: Ethernet (IEEE 802.3), remote direct memory access (RDMA), InfiniB and, Internet Wide Area RDMA Protocol (iWARP), quick UDP Internet Connections (QUIC), RDMA over Converged Ethernet (RoCE), Peripheral Component Interconnect express (PCIe), Intel QuickPath Interconnect (QPI), Intel Ultra Path Interconnect (UPI), Intel On-Chip System Fabric (IOSF), Omnipath, Compute Express Link (CXL), HyperTransport, high-speed fabric, NVLink, Advanced Microcontroller Bus Architecture (AMBA) interconnect, OpenCAPI, Gen-Z, Cache Coherent Interconnect for Accelerators (CCIX), 3GPP Long Term Evolution (LTE) (4G), 3GPP 5G, and variations thereof. Data can be copied or stored to virtualized storage nodes using a protocol such as NVMe over Fabrics (NVMe-oF) or NVMe.

Embodiments herein may be implemented in various types of computing and networking equipment, such as switches, routers, racks, and blade servers such as those employed in a data center and/or server farm environment. The servers used in data centers and server farms comprise arrayed server configurations such as rack-based servers or blade servers. These servers are interconnected in communication via various network provisions, such as partitioning sets of servers into Local Area Networks (LANs) with appropriate switching and routing facilities between the LANs to form a private Intranet. For example, cloud hosting facilities may typically employ large data centers with a multitude of servers. A blade comprises a separate computing platform that is configured to perform server-type functions, that is, a "server on a card." Accordingly, each blade includes components common to conventional servers, including a main printed circuit board (main board) providing internal wiring (i.e., buses) for coupling appropriate integrated circuits (ICs) and other components mounted to the board.

Figure 9:
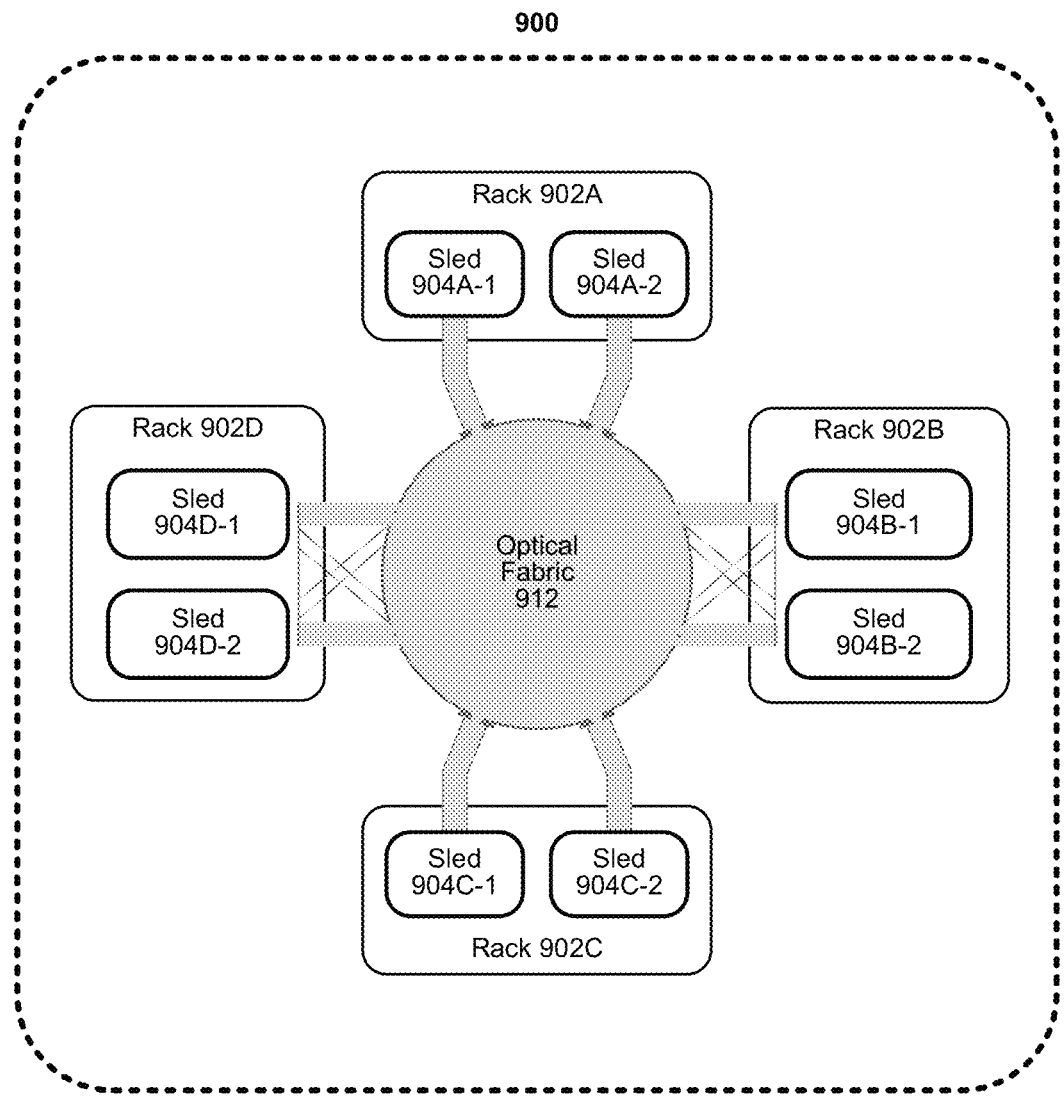
FIG. 9 depicts a system.

FIG. 9 depicts an example of a data center. As shown in FIG. 9, data center 900 may include an optical fabric 912. Various embodiments can be used in fabric 912. Optical fabric 912 may generally include a combination of optical signaling media (such as optical cabling) and optical switching infrastructure via which any particular sled in data center 900 can send signals to (and receive signals from) the other sleds in data center 900. The signaling connectivity that optical fabric 912 provides to any given sled may include connectivity both to other sleds in a same rack and sleds in other racks. Data center 900 includes four racks 902A to 902D and racks 902A to 902D house respective pairs of sleds 904A-1 and 904A-2, 904B-1 and 904B-2, 904C-1 and 904C-2, and 904D-1 and 904D-2. Thus, in this example, data center 900 includes a total of eight sleds. Optical fabric 912 can provide sled signaling connectivity with one or more of the seven other sleds. For example, via optical fabric 912, sled 904A-1 in rack 902A may possess signaling connectivity with sled 904A-2 in rack 902A, as well as the six other sleds 904B-1, 904B-2, 904C-1, 904C-2, 904D-1, and 904D-2 that are distributed among the other racks 902B, 902C, and 902D of data center 900. The embodiments are not limited to this example. For example, fabric 912 can provide optical and/or electrical signaling.

Figure 10:
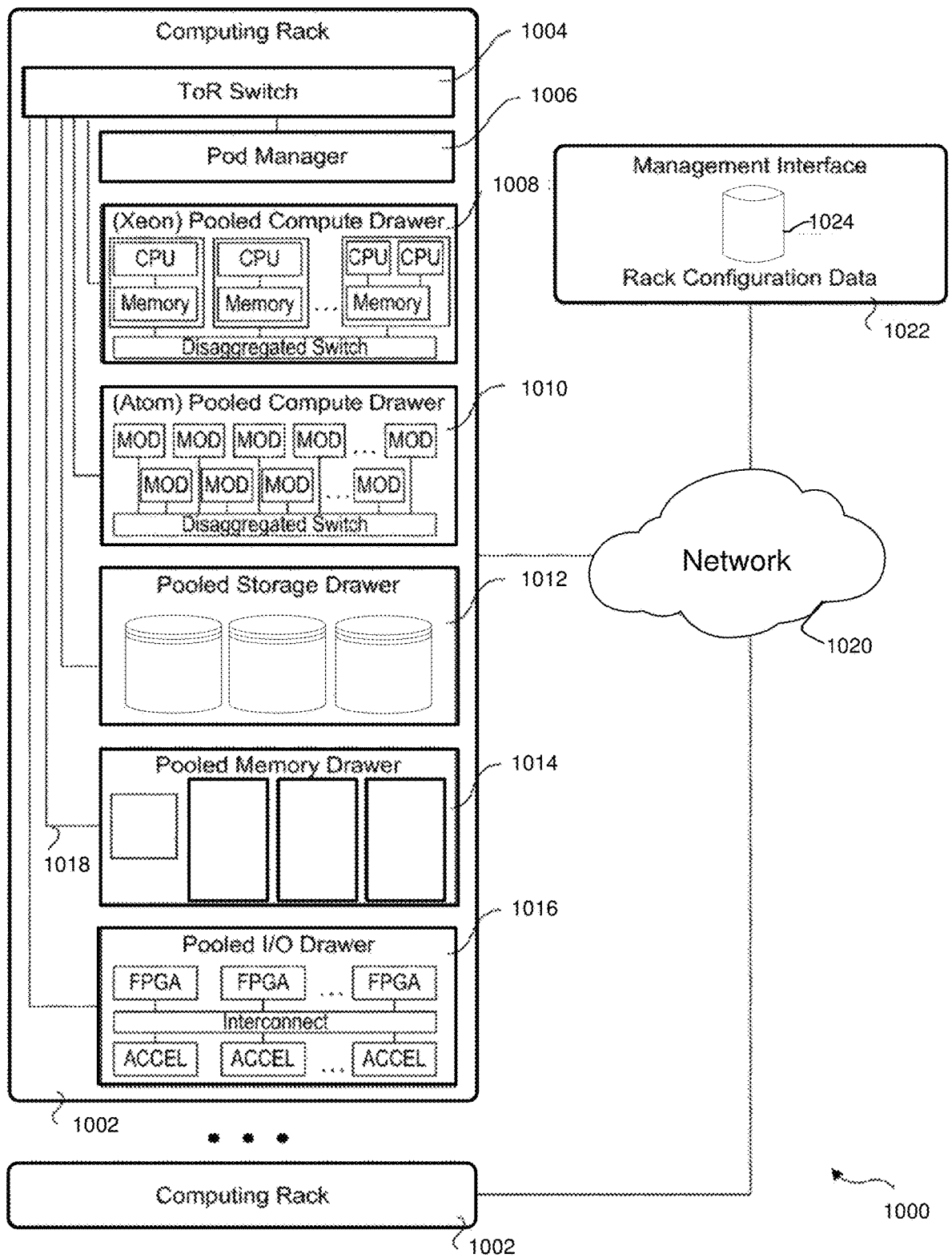
FIG. 10 depicts a data center environment.

FIG. 10 depicts an environment 1000 includes multiple computing racks 1002, each including a Top of Rack (ToR) switch 1004, a pod manager 1006, and a plurality of pooled system drawers. Various embodiments can be used in a switch. Generally, the pooled system drawers may include pooled compute drawers and pooled storage drawers. Optionally, the pooled system drawers may also include pooled memory drawers and pooled Input/Output (I/O) drawers. In the illustrated embodiment the pooled system drawers include an INTEL® XEON® pooled computer drawer 1008, and INTEL® ATOM™ pooled compute drawer 1010, a pooled storage drawer 1012, a pooled memory drawer 1014, and a pooled I/O drawer 1016. Each of the pooled system drawers is connected to ToR switch 1004 via a high-speed link 1018, such as a 40 Gigabit/second (Gb/s) or 100 Gb/s Ethernet link or a 100+Gb/s Silicon Photonics (SiPh) optical link. In one embodiment high-speed link 1018 comprises an 800 Gb/s SiPh optical link.

Multiple of the computing racks 1002 may be interconnected via their ToR switches 1004 (e.g., to a pod-level switch or data center switch), as illustrated by connections to a network 1020. In some embodiments, groups of computing racks 1002 are managed as separate pods via pod manager(s) 1006. In one embodiment, a single pod manager is used to manage all of the racks in the pod. Alternatively, distributed pod managers may be used for pod management operations.

Environment 1000 further includes a management interface 1022 that is used to manage various aspects of the RSD environment. This includes managing rack configuration, with corresponding parameters stored as rack configuration data 1024. Embodiments herein may be implemented in various types of computing, smart phones, tablets, personal computers, and networking equipment, such as switches, routers, racks, and blade servers such as those employed in a data center and/or server farm environment. The servers used in data centers and server farms comprise arrayed server configurations such as rack-based servers or blade servers. These servers are interconnected in communication via various network provisions, such as partitioning sets of servers into Local Area Networks (LANs) with appropriate switching and routing facilities between the LANs to form a private Intranet. For example, cloud hosting facilities may typically employ large data centers with a multitude of servers. A blade comprises a separate computing platform that is configured to perform server-type functions, that is, a "server on a card." Accordingly, each blade includes components common to conventional servers, including a main printed circuit board (main board) providing internal wiring (i.e., buses) for coupling appropriate integrated circuits (ICs) and other components mounted to the board.

Various examples may be implemented using hardware elements, software elements, or a combination of both. In some examples, hardware elements may include devices, components, processors, microprocessors, circuits, circuit elements (e.g., transistors, resistors, capacitors, inductors, and so forth), integrated circuits, ASICs, PLDs, DSPs, FPGAs, memory units, logic gates, registers, semiconductor device, chips, microchips, chip sets, and so forth. In some examples, software elements may include software components, programs, applications, computer programs, application programs, system programs, machine programs, operating system software, middleware, firmware, software modules, routines, subroutines, functions, methods, procedures, software interfaces, APIs, instruction sets, computing code, computer code, code segments, computer code segments, words, values, symbols, or any combination thereof. Determining whether an example is implemented using hardware elements and/or software elements may vary in accordance with any number of factors, such as desired computational rate, power levels, heat tolerances, processing cycle budget, input data rates, output data rates, memory resources, data bus speeds and other design or performance constraints, as desired for a given implementation. A processor can be one or more combination of a hardware state machine, digital control logic, central processing unit, or any hardware, firmware and/or software elements.

Some examples may be implemented using or as an article of manufacture or at least one computer-readable medium. A computer-readable medium may include a non-transitory storage medium to store logic. In some examples, the non-transitory storage medium may include one or more types of computer-readable storage media capable of storing electronic data, including volatile memory or non-volatile memory, removable or non-removable memory, erasable or non-erasable memory, writeable or re-writeable memory, and so forth. In some examples, the logic may include various software elements, such as software components, programs, applications, computer programs, application programs, system programs, machine programs, operating system software, middleware, firmware, software modules, routines, subroutines, functions, methods, procedures, software interfaces, API, instruction sets, computing code, computer code, code segments, computer code segments, words, values, symbols, or any combination thereof.

According to some examples, a computer-readable medium may include a non-transitory storage medium to store or maintain instructions that when executed by a machine, computing device or system, cause the machine, computing device or system to perform methods and/or operations in accordance with the described examples. The instructions may include any suitable type of code, such as source code, compiled code, interpreted code, executable code, static code, dynamic code, and the like. The instructions may be implemented according to a predefined computer language, manner or syntax, for instructing a machine, computing device or system to perform a certain function. The instructions may be implemented using any suitable high-level, low-level, object-oriented, visual, compiled and/or interpreted programming language.

One or more aspects of at least one example may be implemented by representative instructions stored on at least one machine-readable medium which represents various logic within the processor, which when read by a machine, computing device or system causes the machine, computing device or system to fabricate logic to perform the techniques described herein. Such representations, known as "IP cores" may be stored on a tangible, machine readable medium and supplied to various customers or manufacturing facilities to load into the fabrication machines that actually make the logic or processor.

The appearances of the phrase "one example" or "an example" are not necessarily all referring to the same example or embodiment. Any aspect described herein can be combined with any other aspect or similar aspect described herein, regardless of whether the aspects are described with respect to the same figure or element. Division, omission or inclusion of block functions depicted in the accompanying figures does not infer that the hardware components, circuits, software and/or elements for implementing these functions would necessarily be divided, omitted, or included in embodiments.

Some examples may be described using the expression "coupled" and "connected" along with their derivatives. These terms are not necessarily intended as synonyms for each other. For example, descriptions using the terms "connected" and/or "coupled" may indicate that two or more elements are in direct physical or electrical contact with each other. The term "coupled," however, may also mean that two or more elements are not in direct contact with each other, but yet still co-operate or interact with each other.

The terms "first," "second," and the like, herein do not denote any order, quantity, or importance, but rather are used to distinguish one element from another. The terms "a" and "an" herein do not denote a limitation of quantity, but rather denote the presence of at least one of the referenced items. The term "asserted" used herein with reference to a signal denote a state of the signal, in which the signal is active, and which can be achieved by applying any logic level either logic 0 or logic 1 to the signal. The terms "follow" or "after" can refer to immediately following or following after some other event or events. Other sequences of steps may also be performed according to alternative embodiments. Furthermore, additional steps may be added or removed depending on the particular applications. Any combination of changes can be used and one of ordinary skill in the art with the benefit of this disclosure would understand the many variations, modifications, and alternative embodiments thereof.

Disjunctive language such as the phrase "at least one of X, Y, or Z," unless specifically stated otherwise, is otherwise understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present. Additionally, conjunctive language such as the phrase "at least one of X, Y, and Z," unless specifically stated otherwise, should also be understood to mean X, Y, Z, or any combination thereof, including "X, Y, and/or Z.'"

Illustrative examples of the devices, systems, and methods disclosed herein are provided below. An embodiment of the devices, systems, and methods may include any one or more, and any combination of, the examples described below.

What is claimed is:

1. An apparatus comprising:
a solid state drive (SSD) device comprising:
first circuitry to:
receive a configuration of at least one type of command, the configuration to define an amount of media bandwidth allocated for the at least one type of command,
receive a command, wherein a type of the received command is one of the at least one type of command and wherein the type of command comprises a compute command, and
assign the received command to second circuitry for execution based on the configuration, wherein the compute command is to cause processing of data read from a media and the second circuitry is to perform inferences artificial intelligence and machine learning; and
a third circuitry to provide a connection with the first circuitry.

2. The apparatus of claim 1, wherein an amount of media bandwidth associated with execution of the received command by the second circuitry is based on the configuration.

3. The apparatus of claim 1, wherein the configuration is to indicate a number of compute commands that are permitted to be performed over a period of time.

4. The apparatus of claim 1, wherein the configuration is to indicate allocated media input and/or output bandwidth.

5. The apparatus of claim 1, wherein the first circuitry is to receive a second command and a type of the second command includes a storage type and wherein the configuration is to indicate a number of storage commands that are permitted to be performed over a period of time.

6. The apparatus of claim 1, wherein the first circuitry is to receive a second command and a type of the second command includes a storage type and wherein the configuration is to indicate allocated media input and/or output bandwidth.

7. The apparatus of claim 1, wherein the second circuitry is to perform one or more of: augmented reality overlay applications, face recognition, object recognition, voice recognition, or language translation.

8. The apparatus of claim 1, wherein the SSD comprises at least one memory device coupled to the third circuitry to communicate with the first circuitry.

9. The apparatus of claim 8, wherein the at least one memory device comprises one or more of:
a volatile memory, cache, a memory pool of persistent memory, phase change memory, memory device that use chalcogenide phase change material, and/or resistive memory including metal oxide base.

10. A solid state drive (SSD) comprising:
a media comprising one or more of: a volatile memory, cache, memory pool, an N-byte-addressable memory device, phase change memory, memory device that use chalcogenide phase change material, and/or resistive memory including metal oxide base;
first circuitry to execute one or more commands; and
second circuitry to:
receive a configuration of at least one type of command, the configuration to define an amount of media bandwidth allocated for the at least one type of command,
receive a command, wherein a type of the received command is one of the at least one type of command, and
assign the received command to the first circuitry for execution based on the configuration, wherein the received command is a compute command to cause processing of data read from the media by the first circuitry and wherein the first circuitry is to perform inferences artificial intelligence and machine learning.

11. The solid state drive of claim 10, wherein an amount of media bandwidth associated with execution of the received command by the second circuitry is based on the configuration.

12. The solid state drive of claim 10, wherein the configuration is to indicate a number of compute commands that are permitted to be performed over a period of time.

13. The solid state drive of claim 10, wherein the configuration is to indicate allocated media input and/or output bandwidth.

14. The solid state drive of claim 10, wherein the second circuitry is to receive a second command and a type of the second command includes a storage type and wherein the configuration is to indicate a number of storage commands that are permitted to be performed over a period of time.

15. The solid state drive of claim 10, wherein the second circuitry is to receive a second command and a type of the second command includes a storage type and wherein the configuration is to indicate allocated media input and/or output bandwidth.

16. The solid state drive of claim 10, wherein the first circuitry is to perform one or more of: augmented reality overlay applications, face recognition, object recognition, voice recognition, or language translation.

17. The solid state drive of claim 10, wherein the first circuitry is to decode data from the media and store decoded data to the media.

18. The solid state drive of claim 10, wherein the first circuitry is to decrypt data from media and store decrypted data to the media.

19. The solid state drive of claim 10, wherein the first circuitry is to provide an indication of a command status.

20. The solid state drive of claim 10, comprising a network interface controller to receive the command.

* * * * *